United States Patent
Kim et al.

(10) Patent No.: US 7,388,329 B2
(45) Date of Patent: Jun. 17, 2008

(54) LIGHT EMITTING DISPLAY

(75) Inventors: Woochan Kim, Gyongki-do (KR);
Jong Geun Yoon, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/397,671

(22) Filed: Apr. 5, 2006

(65) Prior Publication Data
US 2006/0226773 A1    Oct. 12, 2006

(30) Foreign Application Priority Data

| Apr. 6, 2005 | (KR) | 10-2005-0028733 |
| May 10, 2005 | (KR) | 10-2005-0038936 |
| May 10, 2005 | (KR) | 10-2005-0038967 |

(51) Int. Cl.
*H05B 33/00* (2006.01)

(52) U.S. Cl. .......... 313/512; 313/506; 313/292; 313/46

(58) Field of Classification Search ......... 313/498–512
See application file for complete search history.

(56) References Cited

U.S. PATENT DOCUMENTS

2005/0194896 A1* 9/2005 Sugita et al. ............... 315/506
2005/0285520 A1* 12/2005 Cok ........................... 313/512

FOREIGN PATENT DOCUMENTS

KR    2003-0079603    * 10/2003

* cited by examiner

*Primary Examiner*—Ashok Patel
(74) *Attorney, Agent, or Firm*—Morgan, Lewis & Bockius LLP (57) ABSTRACT

The present invention provides a light emitting display with excellent reliability by preventing degradation by heat such as color changes or luminance reduction, through uniform and quick discharge of heat generated internally.

28 Claims, 9 Drawing Sheets

LIGHT EMITTING DISPLAY

This Nonprovisional application claims priority under 35 U.S.C. § 119(a) on Patent Application Nos. 10-2005-0028733 filed in Korea on Apr. 6, 2005 and 10-2005-0038967, 10-2005-0038936 filed in Korea on May 10, 2005 the entire contents of which are hereby incorporated by reference.

BACKGROUND OF THE INVENTION

1. Field of the Invention

The present invention relates to a light emitting display.

2. Description of the Related Art

A light emitting device used in a light emitting display is an active light emitting device in which a light emitting layer is formed between two electrodes. The device is classified into an inorganic light emitting device and an organic light emitting device depending on the light emitting material. The light emitting device is also classified into a passive matrix type device and an active matrix type device depending on the driving method of light emitting layer.

The lifetime of a light emitting display is determined mainly by driving time of the display and degradation of the light emitting device.

The degradation of the light emitting device is caused by heat generated internally and, oxidation of the device by oxygen and moisture permeated into the device, resulting in a reduction of the light emitting area therein.

Such problems are common to active matrix type and passive matrix type light emitting devices. Specially the active matrix type device experiences more heat-related problems than the passive matrix type device. In a device with a larger light emitting area, the center part generates heat of a higher temperature than the outer part.

Figure 1:
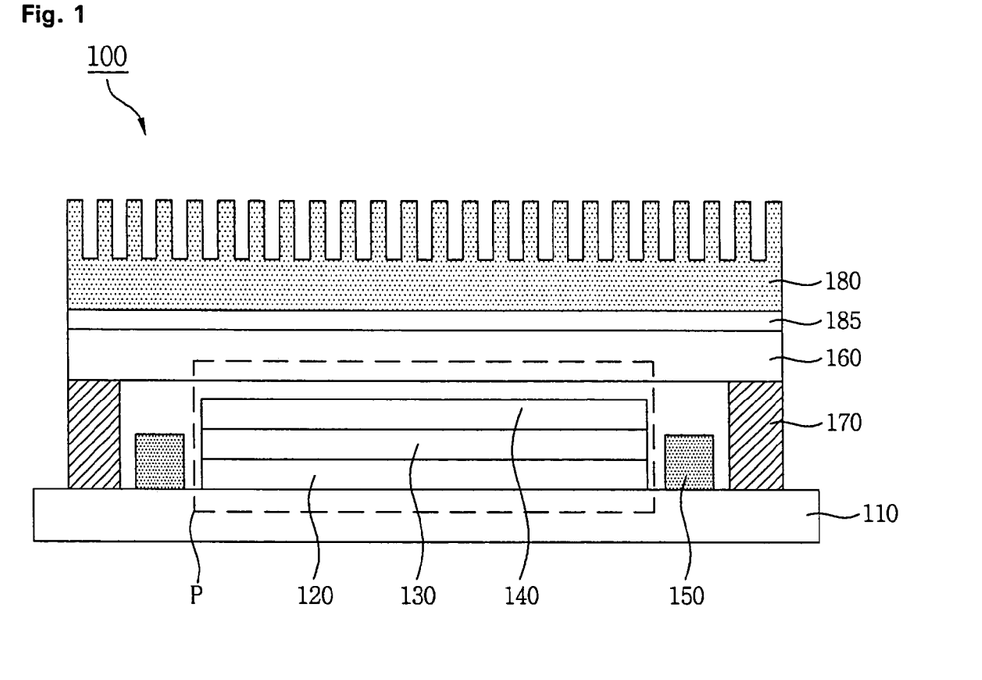
FIG. 1 is a sectional view of a conventional light emitting display.

FIG. 1 is a sectional view of a conventional light emitting device.

Referring to FIG. 1, a light emitting display 100 comprises a pixel circuit part (P) having a first electrode 120, a light emitting part 130, and a second electrode 140 formed on a substrate 110. The first electrode 120 is patterned and insulated by an insulating layer. The organic light emitting part 130 is formed on the first electrode 120, while the second electrode 140 is formed on the light emitting part 130. The substrate 110 is covered with a shield cap 160 and is sealed with a sealant 170 to protect the pixel circuit part (P) from oxygen and moisture permeated into the device.

An getter 150 is inserted into the display 110 for absorption from moisture and/or oxygen. A heat sink 180 is adhered to an outer surface of a shield cap 160 by adhesive 185 for preventing degradation of the display 100 by heat However, since a light emitting display 100 as above is relying solely on the heat sink 180, its capacity to discharge heat generated in the pixel circuit part (P) is very limited.

SUMMARY OF THE INVENTION

Accordingly, an object of the present invention is to solve at least the problems and disadvantages of the related art.

In one aspect of the present invention, there is provided a light emitting display comprising a pixel circuit part including a first electrode formed on a substrate, a light emitting part formed on the first electrode, and a second electrode formed on the light emitting part; a spacer positioned within the pixel circuit part, and formed on the substrate to protrude higher than the light emitting part; and a shield cap formed on or over the spacer.

In another aspect of the present invention, there is provided a light emitting display comprising a substrate; an emissive area comprising a first electrode patterned on the substrate; a light emitting part formed on the substrate; a second electrode formed on the light emitting part; a spacer formed between the substrate and the second electrode to protrude higher than the light emitting part; and a shield cap formed to be in contact with the surface of the second electrode.

The spacer positioned at a central part of the pixel circuit part is larger-sized than a spacer positioned at a peripheral part.

The spacer at a central part of the pixel circuit part can be relatively larger in number than a spacer at a peripheral part.

The spacer can be disposed in various size, number, and shape depending on positions of the pixel circuit part.

The second electrode formed on the spacer is in contact with the inner surface of the shield cap.

A metal layer is formed on the second electrode, which second electrode being formed on the spacer, and the metal layer is in contact with the inner surface of the shield cap.

A getter unit is formed either on the second electrode, or on the second electrode formed on the spacer, or on both.

The getter unit formed over the spacer is in contact with the inner surface of the shield cap.

One or more of a heat sink and a cooling fan can be additionally formed at outter side of the sheild cap.

The area in which the light emitting part is formed can be emissive area, and the other areas can be nonemissive areas.

The getter unit can be of a thin film type.

One or more of the spacer, the shield cap, the heat sink, and the cooling fan can be made metal with a high thermal conductivity.

The spacer is formed either at areas where a thin film transistor, or a storage capacitor is positioned, when the light emitting display is of passive matrix type, while the spacer is formed either at areas where an insulating layer, or barrier rib is formed, or at both, when the light emitting display is of active matrix type.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

First Embodiment

Figure 2:
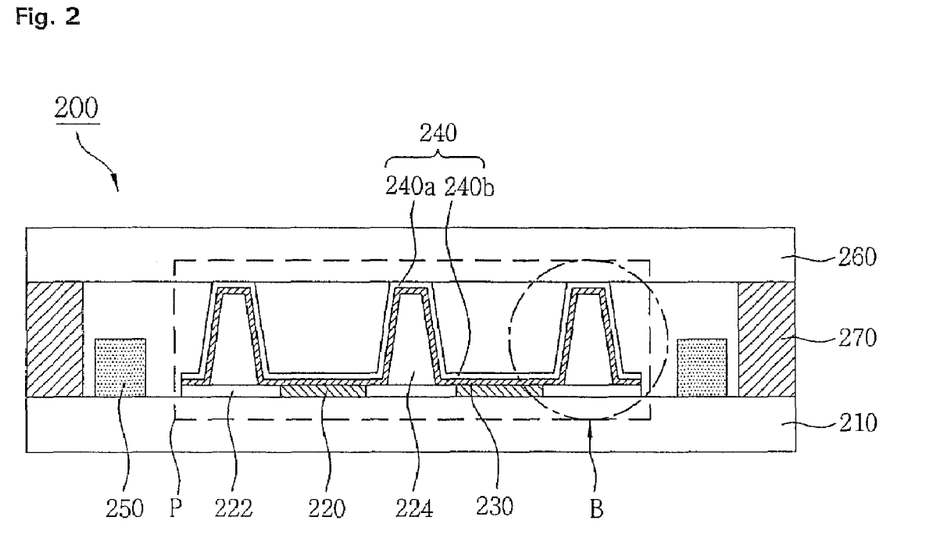
FIG. 2 is a sectional view of a light emitting display according to a first embodiment of the present invention.
Figure 3:
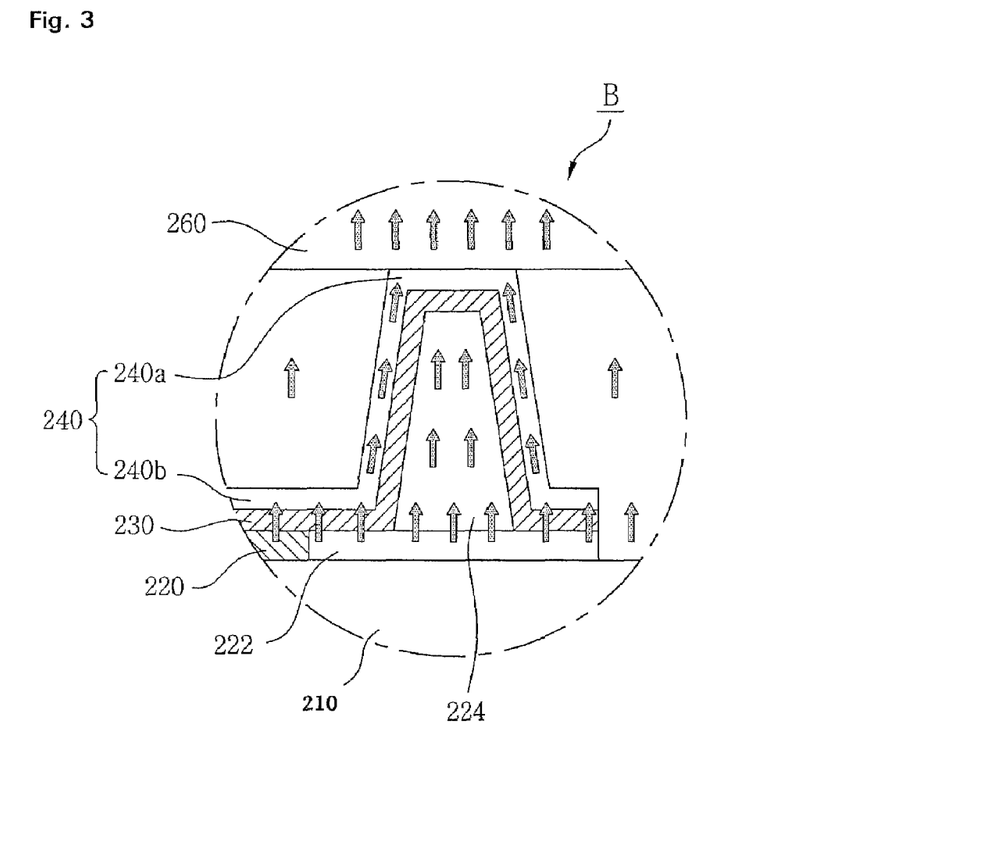
FIG. 3 is a exploded view of part "B" in FIG. 2.

FIG. 2 is a sectional view of a light emitting display according to the first embodiment of the present invention, and FIG. 3 is a exploded view of part "B" in FIG. 2.

Referring to FIG. 2, a light emitting display 200 according to the first embodiment of the present invention comprises a first electrode 220 formed on a substrate 210. The first electrode 220 is patterned and insulated by an insulating layer 222. An organic light emitting part 230 is formed on the first electrode 220, and a second electrode 240 is formed on the light emitting part 230, whereby a pixel circuit part (P) is formed. A getter 250 is adhered to the substrate 210, and a shield cap 260 is adhered to the substrate 210 and sealed with a sealant 270 to protect the pixel circuit part (P) from oxygen and moisture that permeates from the outside of the shield cap 260.

A spacer 224 is formed between the substrate 210 and the second electrode 240 to protrude higher than the light emitting part 230. Accordingly, the second electrode 240 can be classified into a first part 240a formed over the spacer 224 and a second part 240b formed on the light emitting part 230.

As a result, the first part 240a of the second electrode 240 formed on the spacer 224 is in contact with the inner surface of the shield cap 260. Thus, it can easily discharge heat generated by the light emitting part 230 in the pixel circuit part (P).

The spacer 224 can be formed on the insulating layer 222. The area in which the insulating layer 222 is formed is classified as nonemissive area, while the area in which the light emitting part 230 is formed to emit light toward outside is classified as emissive area.

Referring to FIG. 3 which is a exploded view of part "B" in FIG. 2, the spacer 224 formed on the insulating layer 222 is pillar-shaped such that the first art 240a of the second electrode 240 can be in contact with the inner surface of a shield cap 260, whereby the heat generated in the pixel circuit part (P) can be easily be discharged. Further, since the spacer 224 is structured to support the shield cap 260, the display 200 is protected from external force.

In addition, if the spacer 224 is made of a metal having a high thermal conductivity (e.g., aluminum (Al), copper (Cu), argentum (Ag), etc.), the heat generated internally can be transferred to the shield cap 260 through the pillar-shaped spacer 224. Furthermore, the space formed between the shield cap 260 and substrate 210 by the spacer 224 can enhance circulation and discharge of heat generated internally.

Although the light emitting display 200 as shown in FIGS. 2 and 3 is the passive matrix type, the present invention is not limited thereto, but rather, is applicable to both the passive and the active matrix types. A more detailed description thereon is given below.

The spacer 224 can be formed either at areas where an insulating layer, or a barrier rib of the nonemissive area is formed, or at both, when the light emitting display 200 is the passive matrix type.

The spacer 224 can be formed either at areas where a thin film transistor, or a storage capacitor is positioned, or at both, when the light emitting display is the active matrix type.

However, positions of the spacers 224 are not limited thereto, but rather, the spacers 224 can be formed anywhere other than light emitting areas when they can effectively discharge the heat Although not shown in the drawings, the spacer 224 can also be formed such that upper part thereof is in contact with the inner surface of the shield cap 260 without forming the first part 240a of the second electrode 240 at the upper part thereof.

Second Embodiment

Figure 4:
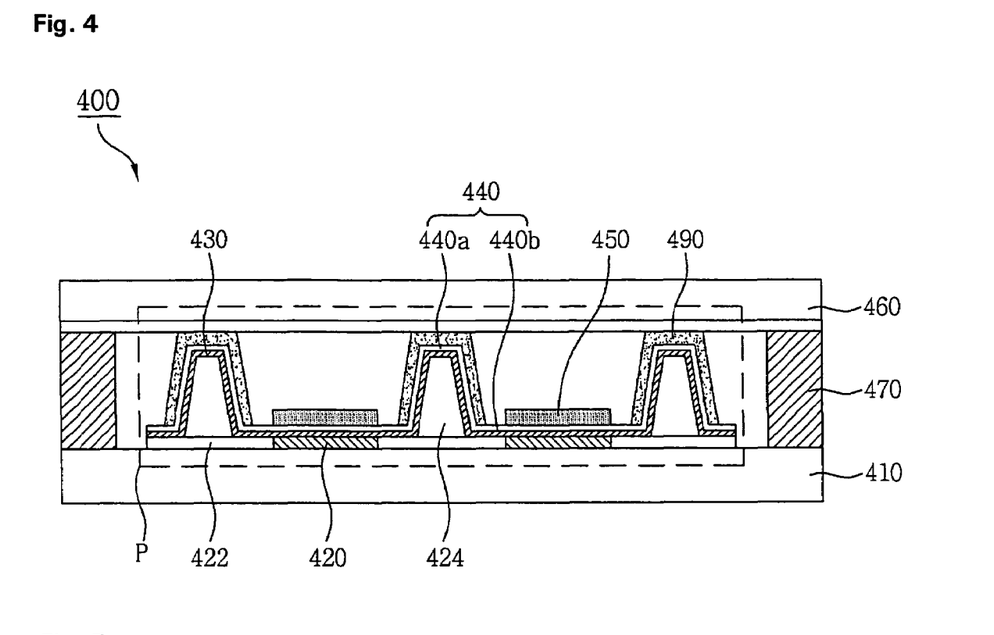
FIG. 4 is a sectional view of a light emitting display according to a second embodiment of the present invention.

FIG. 4 is a sectional view of a light emitting display according to the second embodiment of the present invention.

Referring to FIG. 4, a light emitting display 400 according to the second embodiment of the present invention comprises a first electrode 420 formed on a substrate 410. The first electrode 420 is patterned and insulated by an insulating layer 422. An organic light emitting part 430 is formed on the first electrode 420, and a second electrode 440 is formed over the light emitting part 430, whereby a pixel circuit part (P) is formed. A getter unit 450 is adhered to the second electrode 440, and a shield cap 460 is adhered to the substrate 410 and sealed with a sealant 470 to improtect the pixel circuit part (P) from oxygen and moisture that permeates from the outside of the shield cap 260.

A spacer 424 is formed between the substrate 410 and the second electrode 440 to protrude higher than the light emitting part 430. Accordingly, the second electrode 440 can be classified into a first part 440a formed over the spacer 424 and a second part 440b formed on the light emitting part 430.

Here, the getter unit 450 is adhered to the second part 440b of the second electrode 440 formed on the light emitting part 430, and a metal layer 490 is formed on the first art 440a of the second electrode 440 formed on the spacer 424.

Accordingly, the heat generated from the light emitting part 430 in the pixel circuit part (P) can easily be discharged by the first art 440a of the second electrode 440 formed on the spacer 424, through the metal layer 490 and the shield cap 460, the inner surface of the shield cap 460 being in contact with the metal layer 490.

The spacer 424 can be formed on the insulating layer 422, and the area in which the insulating layer 422 is formed is classified as nonemissive area, while the area in which the light emitting part (P) is formed to emit light toward outside is classified as emissive area.

In detail, the spacer 424 formed on the insulating layer 422 is pillar-shaped such that the metal layer 490 formed on the second electrode 440a can be in contact with the shield cap 460, thereby easily discharging heat generated within the pixel circuit part (P). Further, the spacer 424 can be structured to support the shield cap 460, and protect the device from external force.

In addition, if the spacer 424 is made of a metal having a high thermal conductivity (e.g., aluminum (Al), copper (Cu), argentum (Ag), etc.), the heat generated internally can be transferred to the shield cap 460 through the pillar-shaped spacer 424. Furthermore, the space formed between the shield cap 460 and substrate 410 can enhance circulation and discharge of the generated heat Although the light emitting display 400 as shown in FIG. 4 of the passive matrix type, the present invention is not limited thereto, but rather, is applicable to both the passive and the active matrix types. A more detailed description thereon is given below.

The spacer 424 can be formed either at areas where an insulating layer, or barrier rib is formed, or at both, when the light emitting display 400 is the passive matrix type.

The spacer 424 can be formed either at areas where a thin film transistor, or a storage capacitor is positioned, when the light emitting display 400 is of an active matrix type.

However, position of the spacer 424 is not limited thereto, but rather, it can be formed anywhere other than light emitting areas, when they can effectively discharge the heat. And the metal layer 490 is not limited to a specific material.

Third Embodiment

Figure 5:
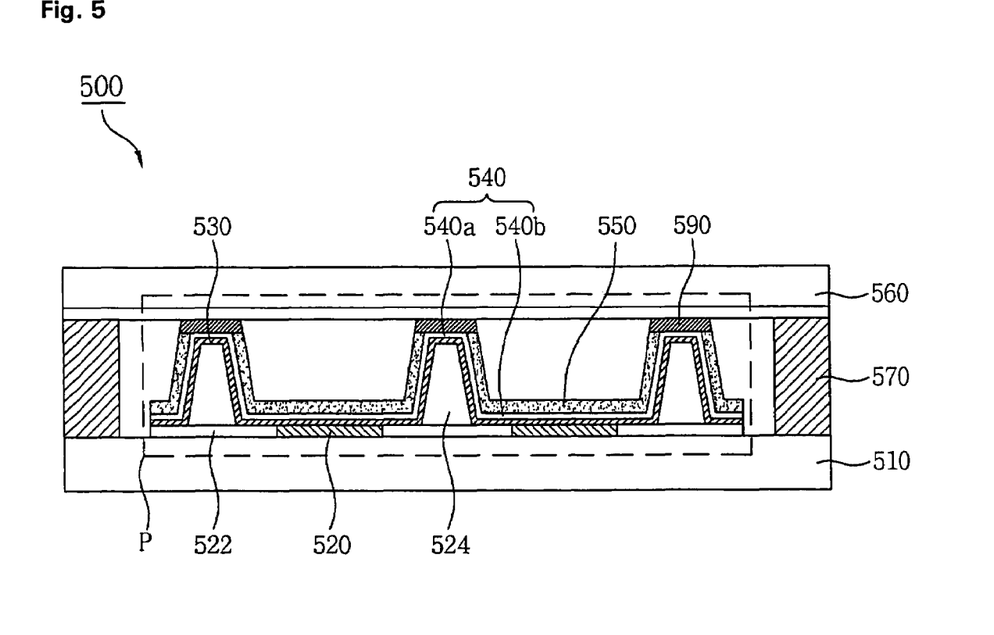
FIG. 5 is a sectional view of a light emitting display according to a third embodiment of the present invention.

FIG. 5 is a sectional view of a light emitting display according to the third embodiment of the present invention.

Referring to FIG. 5, a light emitting display 500 according to the third embodiment of the present invention comprises a first electrode 520 formed on a substrate 510. The first electrode 520 is patterned and insulated by an insulating layer 522. An organic light emitting part 530 is formed on the first electrode 520, and a second electrode 540 is formed over the light emitting part 530, whereby a pixel circuit part (P) is formed. A getter unit 550 is adhered to the second electrode 540, and a shield cap 560 is adhered to the substrate 510 and sealed with a sealant 570 to protect the pixel circuit part (P).

A spacer 524 is formed between the substrate 510 and the second electrode 540 to protrude higher than the light emitting part 530. Accordingly, the second electrode 540 can be classified into a first part 540a formed on the spacer 524 and a second part 540b formed on the light emitting part 530.

Here, the getter unit 550 is formed either on the second electrode 540b, or up to the upper part of the spacer 524, and a metal layer 590 is formed on upper part of the second electrode 540a.

Accordingly, the heat generated by the light emitting part 530 in the pixel circuit part (P) can easily be discharged by the first part 540a of the second electrode 540 formed on the spacer 524, through the metal film 590 and the shield cap 560, the inner surface of the shield cap 560 being in contact with the metal layer 590.

Furthermore, the thin film type getter 550 formed on the second art 540b of the second electrode 540 can serve as a protective film for directly cutting off an heating by which a device in the pixel circuit part (P) is degraded by moisture or oxygen.

The spacer 524 can be formed on the insulating layer 522, and the area in which the insulating layer 522 is formed is classified as nonemissive area, while the area in which the light emitting part is formed and light is emitted is classified as emissive area.

In detail, the spacer 524 formed on the insulating layer 522 is pillar-shaped such that the metal layer 590 formed on the first part 540a of the second electrode 540 can be in contact with the shield cap 560, thereby easily discharging heat generated within the pixel circuit part (P). Further, the spacer 524 can be structured to support the shield cap 560, and protect the device from external pressure.

In addition, if the spacer 524 is made of a metal having a high thermal conductivity (e.g., aluminum (Al), copper (Cu), argentum (Ag), etc.), the heat generated internally can be transferred to the shield cap 560 through the pillar-shaped spacer 524. Furthermore, the space between the shied cap 560 and the substrate 510 by the spacer 524 can enhance circulation and discharge of heat generated internally.

Although the light emitting display as shown in FIG. 5 is the passive matrix type, the present invention is not limited thereto, but rather, is applicable to both the passive and the active matrix types. A more detailed description thereon is given below.

The spacer 524 can be formed either at areas where an insulating layer, or barrier rib is formed, or at both, when the light emitting display is of the passive matrix type.

The spacer 524 can be formed either at areas where a thin film transistor, or a storage capacitor is positioned, when the light emitting display is the active matrix type.

However, position of the spacer 524 is not limited thereto, but rather, it can be formed anywhere other than light emitting areas, when they can effectively discharge the heat. And the metal layer 590 is not limited to a specific material.

Fourth Embodiment

Figure 6:
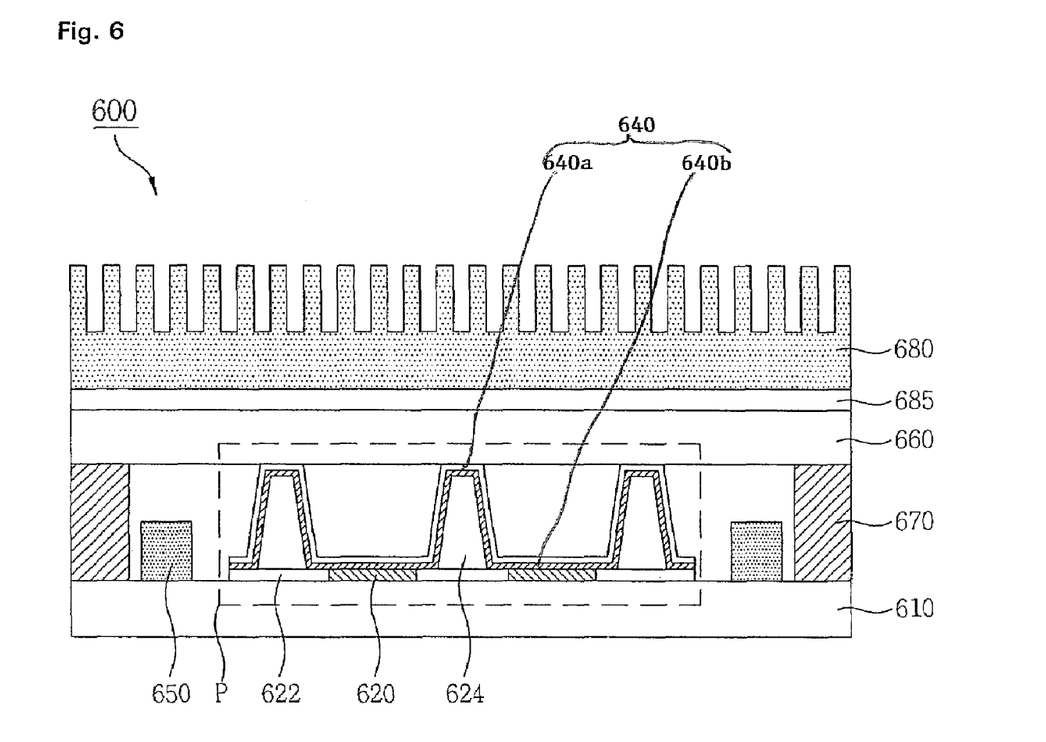
FIG. 6 is a sectional view of a light emitting display according to a fourth embodiment of the present invention.

FIG. 6 is a sectional view of a light emitting display according to the fourth embodiment of the present invention.

Referring to FIG. 6, a light emitting display 600 according to the fourth embodiment of the present invention comprises a first electrode 620 formed on a substrate 610. The first electrode 620 is patterned and insulated by an insulating layer 622. An organic light emitting part 630 is formed on the first electrode 620, and a second electrode 640 is formed over the light emitting part 630, whereby a pixel circuit part (P) is formed. A getter unit 650 is adhered to the second electrode 640, and a shield cap 660 is adhered to the substrate 610 and sealed with a sealant 670.

A spacer 624 is formed between the substrate 610 and the second electrode 640 to protrude higher than the light emitting part 630. Accordingly, a second electrode 640 can be classified into a first part 640a formed over the spacer 624 and a second part 640b formed on the light emitting part 630.

Here, the getter 650 can be formed at one side of the substrate 610, or, although not shown in the drawing, at one side of the shield cap 660.

On the other hand, one or more of a heat sink or a cooling fan can be adhered to an outer side of the shield cap 660, using an adhesive 685, etc. with excellent thermal conductivity.

Accordingly, the heat generated by the light emitting part 630 in the pixel circuit part (P) can easily be discharged by the first part 640a of he second electrode 640 formed to contact the shield cap 660 over the spacer 624, through the shield cap 660, the shield cap 660 being in surface contact with the lint part 640a of the second electrode 640. Also, the heat sink or cooling fan 680 formed at outer side of the shield cap 660 can contribute to quickly reduce the heat generated in the pixel circuit portion (P).

The spacer 624 can be formed on the insulating layer 622, and the area in which the insulating layer 622 is formed is classified as nonemissive area, while the area in which the light emitting part is formed to emit light is classified as emissive area.

In detail, the spacer 624 formed on the insulating layer 622 is pillar-shaped such that a metal layer (not shown) formed on the first part 640a of the second electrode 640 can be in contact with the shield cap 660, whereby easily discharging the heat generated in the pixel circuit part (P). Further, the spacer 624 can be structured to support the shield cap 660, and protect the device from external force. The heat sink or cooling fan 680 can reduce the generated heat more quickly.

In addition, if the spacer 624, or the heat sink, or the cooling fan 680 is made of a metal having a high thermal conductivity (e.g., aluminum (Al), copper (Cu), argentum (Ag), etc.), the heat generated internally can be discharged through the spacer 624 as well as the heat sink or the cooling fan 680. Furthermore, the space between the shield cap 660 and the substrate 610 by the spacer 624 can enhance circulation and discharge of the generated heat.

Although the light emitting display as shown in FIG. 6 is the passive matrix type, the present invention is not limited thereto, but rather, is applicable to both the passive and the active matrix types. A more detailed description thereon is given below.

The spacer 624 can be formed either at areas where an insulating layer, or barrier rib is formed, or at both, when the light emitting display is of the passive matrix type.

The spacer 624 can be formed either at areas where a thin film transistor, or a storage capacitor is positioned, when the light emitting display is of an active matrix type.

However, position of the spacer 624 is not limited thereto, but rather, it can be formed anywhere other than light emitting areas, when they can effectively discharge the heat. And the heat sink or cooling fan 680 is not limited to a specific material.

Figure 7:
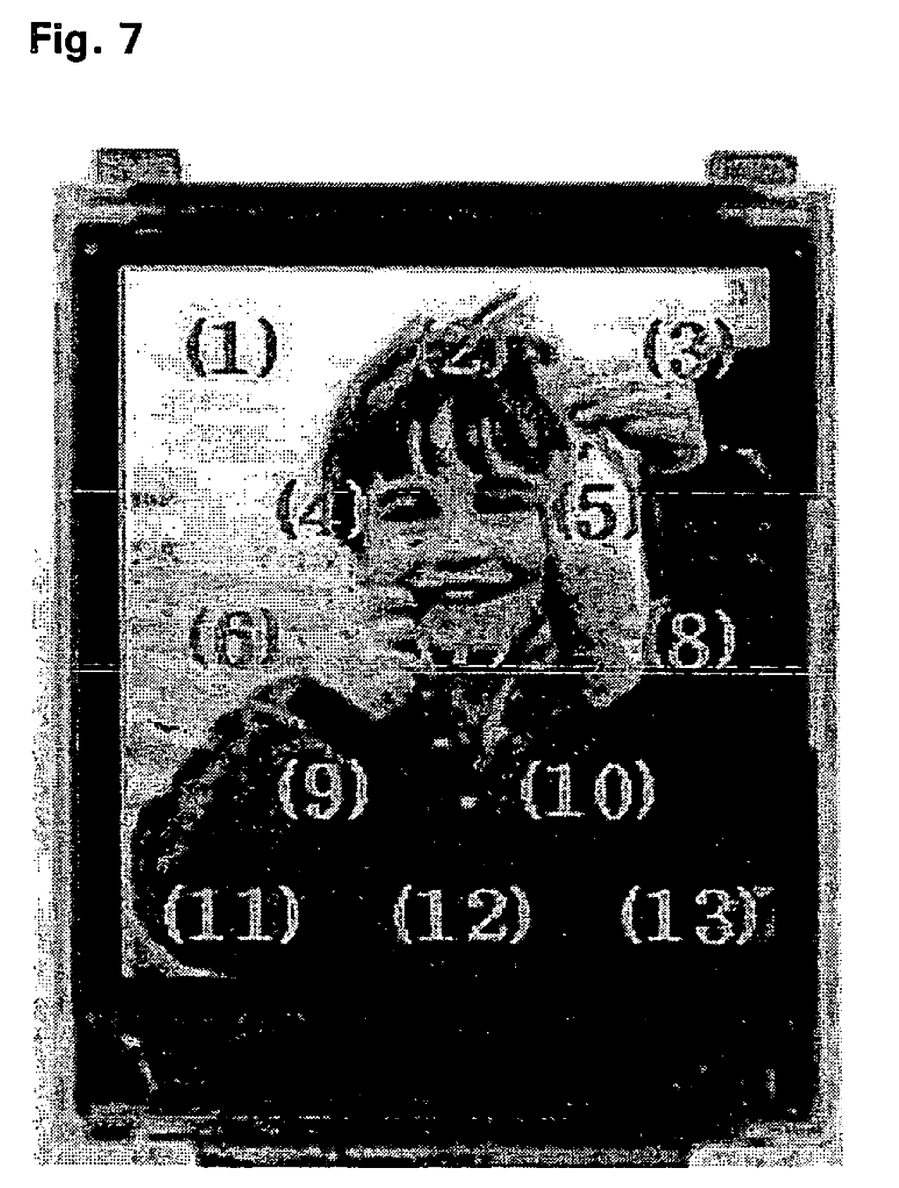
FIG. 7 illustrates a panel showing examples of spacer positions in the above embodiments of the present invention.
Figure 8A:
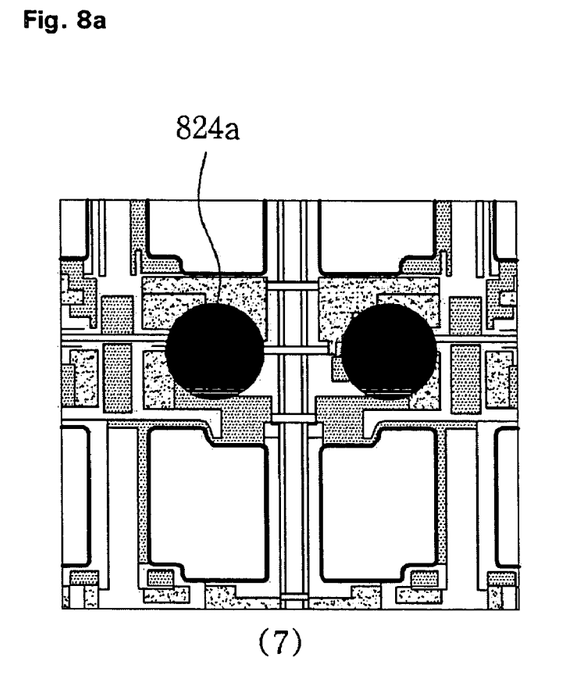
FIGS. 8a to 8h illustrate examples of the spacer in FIG. 7.
Figure 8B:
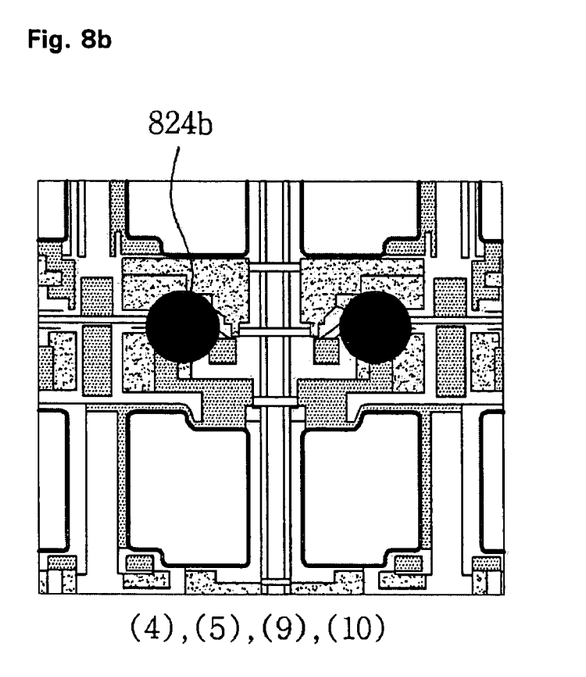
Figure 8C:
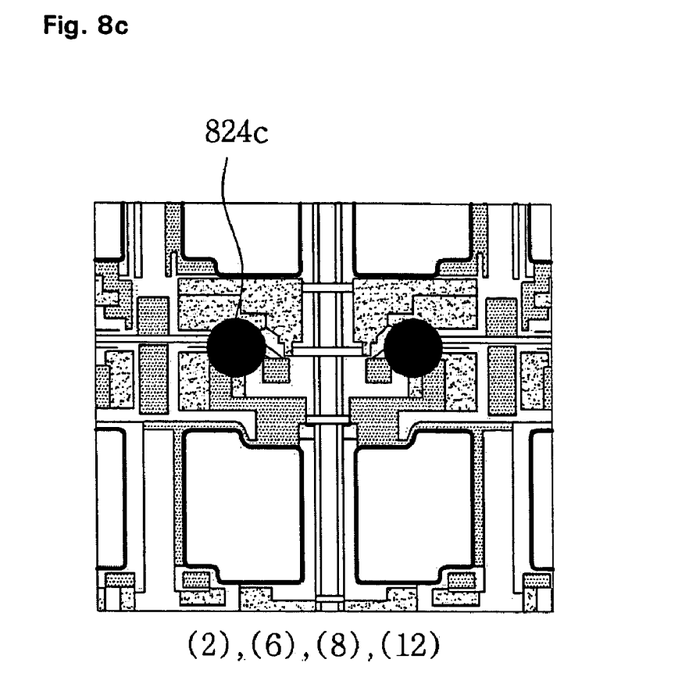
Figure 8D:
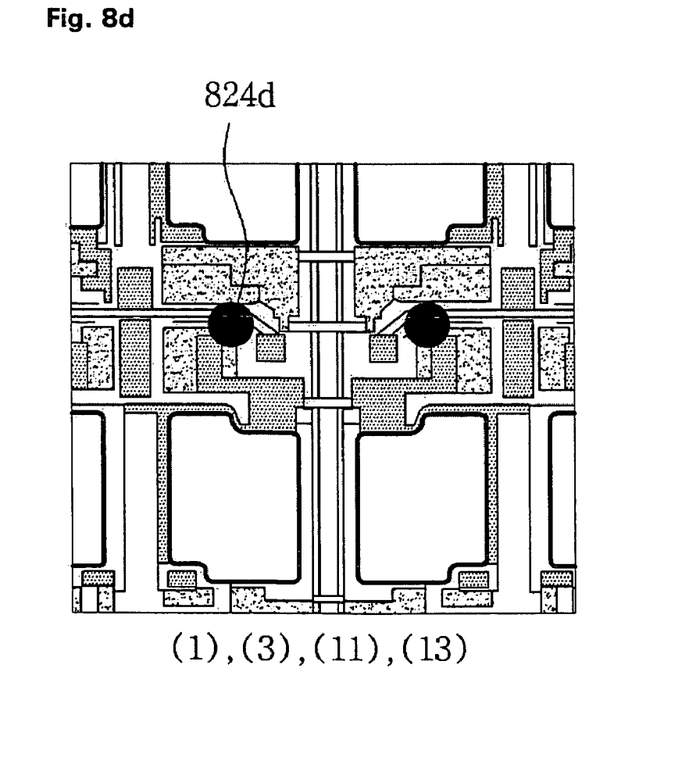
Figure 8E:
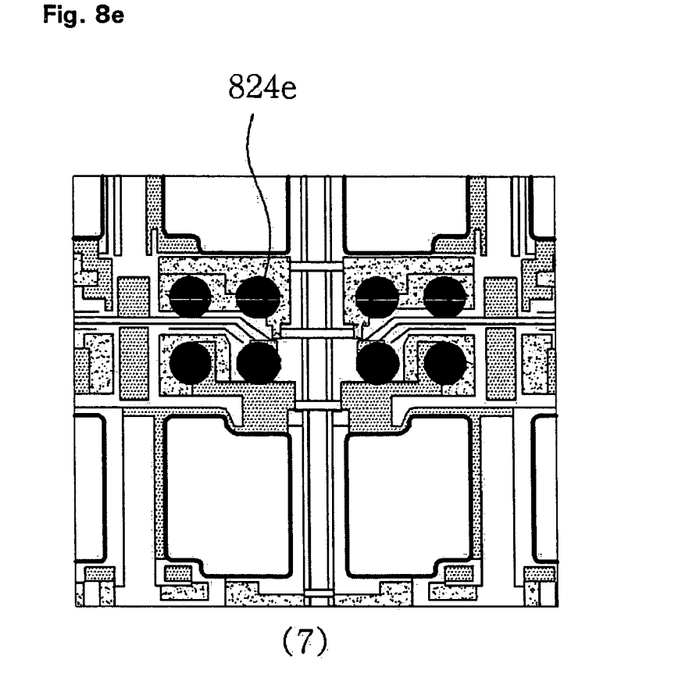
Figure 8F:
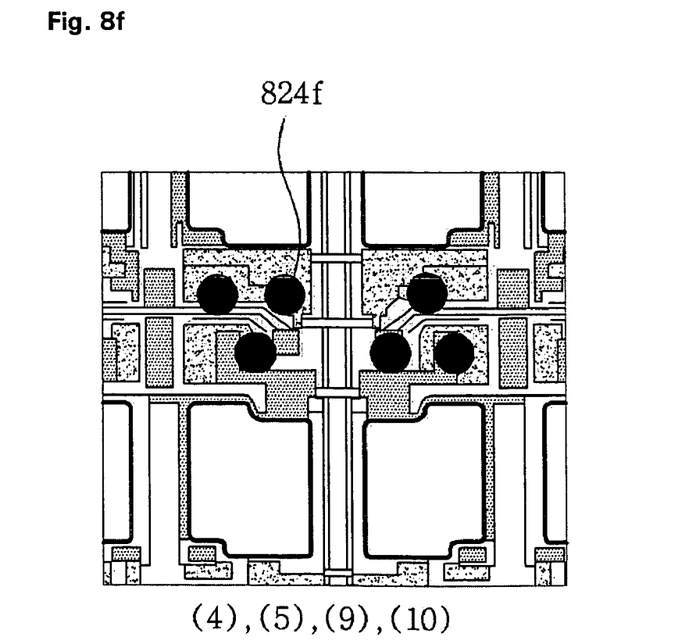
Figure 8G:
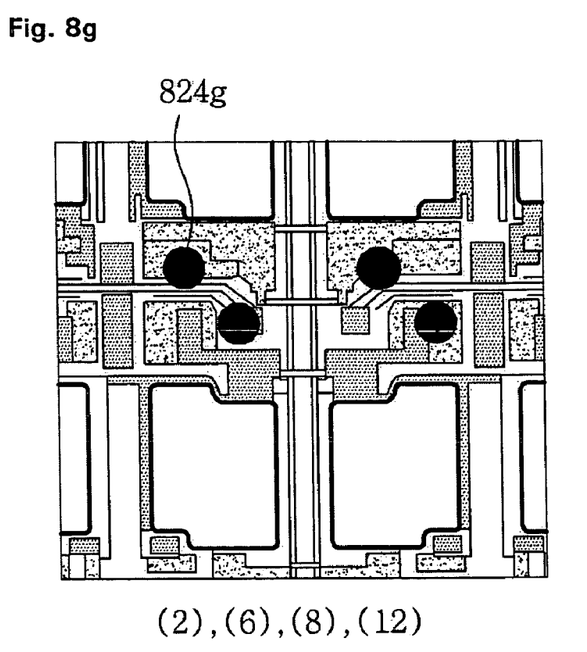
Figure 8H:
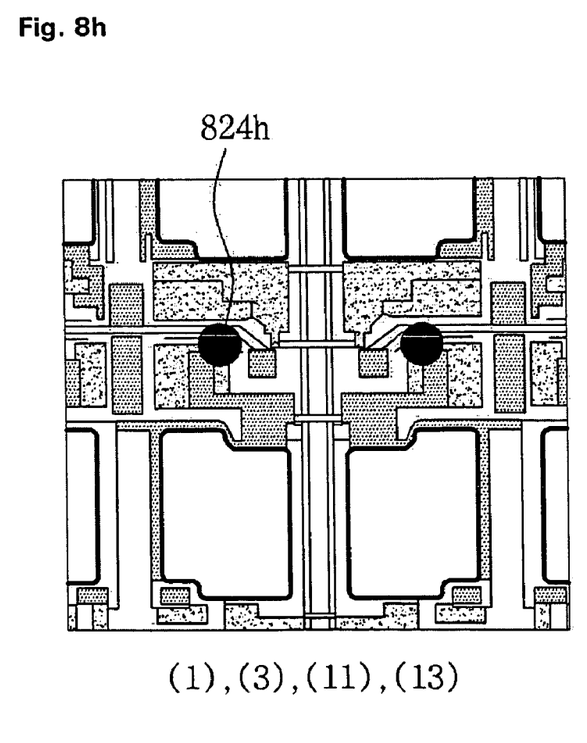

FIGS. 7 to 8*h* show areas where the spacer is positioned in different embodiments of the present invention.

FIG. 7 illustrates a panel showing examples of spacer positions in different embodiments of the present invention, and FIGS. 8*a* to 8*h* illustrate examples of the spacer in FIG. 7.

As shown in FIG. 7, the panel is sectioned in a plurality of areas, and the spacers are differently formed depending on the amount of heat generated from the respective area.

As to the temperature distribution on the panel, the central part of the panel has a higher temperature than the outer part due to the more heat generated there, and the temperature becomes lower toward the outer part. Accordingly, the spacers can be formed variously in a manner that a spacer with a larger diameter is formed at the center part, and one with a smaller diameter is formed at the outer part.

As shown in FIG. 8*a*, a spacer with the largest diameter 824*a* is formed at the center of the panel 7 where the highest temperature is generated.

FIG. 8*b* shows spacers with relatively small diameter 824*b* formed at the peripheries 4, 5, 9, and 10 of the central part.

FIG. 8*c* shows spacers with diameters of a third dimension 824*c* formed at side central parts 2, 6, 8, and 12 of the panel.

FIG. 8*d* shows spacers with the smallest diameter 824*d* formed at outermost parts 1, 3, 11, and 13.

Referring to FIGS. 8*e* to 8*h*, which show examples in other example embodiments of the present invention, four spacers 824*e* are formed at the central part 7 of FIG. 8*a* where spacer with the largest diameter 824*a* is formed, and three spacers 824*f* are formed at the peripheries 4, 5, 9, or 10 of the center of FIG. 8*b*.

Two spacers 824*g* are formed at the side central parts 2, 6, 8, and 12 of FIG. 8*c*, and one spacer 824*h* is formed at outermost parts 1, 3, 11, and 13 of FIG. 8*d*.

In the aforementioned panel temperature distribution, if analysis and measurements are made using simulations, and the spacer is formed in different sizes, positions, shapes, and numbers, the generated heat can be more effectively discharged. In addition, it is more effective, if the number of spacers is gradually reduced for areas having a lower temperature, or the spacer are disposed to maintain up/down and/or left/right balance so that the amounts of generated heat and discharged heat are in balance.

As described above, the present invention allows the light emitting devices positioned at the central part and the peripheral part of a panel to uniformly and quickly discharge the generated heat so that deteriorations by heat such as color changes or luminance reduction can be prevented, whereby providing a light emitting display with excellent reliability.

The invention being thus described it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting display comprising,
   a pixel circuit part including a first electrode formed on a substrate, a light emitting part formed on the first electrode, and a second electrode formed on the light emitting part;
   a plurality of spacers positioned within the pixel circuit part, and formed on the substrate to protrude from an area adjacent the light emitting part to an area higher than the light emitting part, wherein a first one of the plurality of spacers positioned at a central part of the pixel circuit part is larger than a second one of the plurality of spacers positioned at a peripheral part of the pixel circuit part; and
   a shield cap formed on the spacer.

2. The display of claim 1, further comprising a plurality of insulating parts formed on the substrate.

3. The display of claim 2, wherein the insulating parts are formed of a material different than the spacers.

4. The display of claim 1, wherein the plurality of spacers are disposed in various sizes, numbers, and shapes depending on a position of the respective spacers within the pixel circuit part.

5. The display of claim 1, wherein the second electrode formed on the spacer is in contact with an inner surface of the shield cap.

6. The display of claim 1, further comprising a metal layer formed on the second electrode, and in contact with an inner surface of the shield cap.

7. The display of claim 1, further comprising a getter unit formed on the second electrode in an emissive area, or on the second electrode formed on the spacer in non-emissive area.

8. The display of claim 7, wherein the getter unit formed on the spacer contacts an inner surface of the shield cap.

9. The display of claim 7, wherein the getter unit is of thin film type.

10. The display of claim 1, further comprising one of a heat sink or a cooling fan provided on an outer side of the shield cap.

11. The display of claim 10, wherein one or more of the spacer, the shield cap, the heat sink, or the cooling fan is made of metal with a high thermal conductivity.

12. The display of claim 1, wherein the light emitting part is formed at emissive areas, while other areas are nonemissive areas.

13. The display of claim 1, wherein the spacer is formed either at areas where a thin film transistor or a storage capacitor is positioned when the light emitting display is an active matrix type, or the spacer is formed at areas where an insulating layer or a barrier rib is formed when the light emitting display is a passive matrix type.

14. The display of claim 1, wherein the light emitting part comprises an organic emitting layer.

15. The display of claim 1, wherein the first one of the plurality of spacers has a base portion at an area adjacent the light emitting part that is wider than a top portion of the first one of the plurality of spacers at the area higher than the light emitting part.

16. The display of claim 1, wherein the first one of the spacers directly contacts the shield cap.

17. A light emitting display comprising, a pixel circuit part including a first electrode formed on a substrate, a light emitting part formed on the first electrode and a second electrode formed on the light emitting part;

a plurality of spacers positioned on the substrate and within the pixel circuit part each to protrude from a base area of the respective spacer to a top area of the respective spacer higher than the light emitting part, wherein a width of the base area for each respective spacer is greater than a width of the top area for the respective spacer; and a shield cap formed on the spacer, wherein the plurality of spacers includes a first group of spacers positioned at a central part of the pixel circuit part and a second group of spacers positioned at a peripheral part of the pixel circuit part, wherein a number of the first group of spacers is greater than a number of the second group of spacers.

18. The display of claim 17, wherein a first spacer of the first group of spacers positioned at the central part of the pixel circuit part is larger than a second spacer of the second group of spacers positioned at the peripheral part of the pixel circuit part.

19. The display of claim 17, further comprising a getter unit formed on the second electrode in an emissive area of the display or on the second electrode formed on the spacer in a non-emissive area of the display.

20. The display of claim 17, wherein one of the plurality of spacers has a base portion at an area adjacent the light emitting part that is wider than a top portion of the one of the plurality of spacers at an area higher than the light emitting part.

21. A light emitting display comprising, a substrate;

a first electrode on the substrate having a length extending along a direction;

a light emitting part formed on the first electrode;

a second electrode formed on the light emitting part, wherein the first electrode, the light emitting part and the second electrode form an emissive area of the display;

a plurality of insulating parts formed on the substrates;

a plurality of spacers formed on the insulating parts between the substrate and the second electrode, each of the spacers to protrude higher than the light emitting part, wherein a distance between adjacent spacers is greater than the length of the first electrode; and a shield cap formed on the spacer.

22. The display of claim 21, wherein the plurality of spacers are formed in non-emissive areas of the display outside of the emissive area.

23. The display of claim 21 wherein the plurality of spacers are formed at areas where an insulating layer or a barrier rib is formed when the light emitting display is a passive matrix type, or the plurality of spacers are formed at areas where a thin film transistor or a storage capacitor is positioned when the light emitting display is an active matrix type.

24. The display of claim 21, wherein the light emitting portion comprises an organic light emitting layer.

25. The display of claim 21, wherein the spacers do not contact the first electrode.

26. The display of claim 21, wherein a first one of the plurality of spacers positioned at a central part of the pixel circuit part is larger than a second one of the plurality of spacers positioned at a peripheral part of the pixel circuit part.

27. The display of claim 21, further comprising a getter unit formed on the second electrode in an emissive area of the display or on the second electrode formed on one of the spacers in a non-emissive area of the display.

28. The display of claim 21, wherein one of the plurality of spacers has a base portion at an area adjacent the light emitting part that is wider than a top portion of the one of the plurality of spacers at the area higher than the light emitting part.

* * * * *